United States Patent
Tinnemans et al.

(10) Patent No.: US 8,089,672 B2
(45) Date of Patent: Jan. 3, 2012

(54) ARRAY ELEMENT DEVICE CONTROL METHOD AND APPARATUS

(75) Inventors: Patricius Aloysius Jacobus Tinnemans, Hapert (NL); Heine Melle Mulder, Veldhoven (NL); Marius Ravensbergen, Bergeijk (NL); Wilfred Edward Endendijk, Sleensel (NL); Jozef Ferdinand Dymphna Verbeeck, Geel (BE)

(73) Assignee: ASML Netherlands B.V., Veldhoven (NL)

(*) Notice: Subject to any disclaimer, the term of this patent is extended or adjusted under 35 U.S.C. 154(b) by 419 days.

(21) Appl. No.: 12/318,034

(22) Filed: Dec. 19, 2008

(65) Prior Publication Data

US 2009/0190197 A1    Jul. 30, 2009

Related U.S. Application Data

(60) Provisional application No. 61/008,293, filed on Dec. 20, 2007.

(51) Int. Cl.
G02B 26/08    (2006.01)

(52) U.S. Cl. .................. 359/199.2; 359/200.6

(58) Field of Classification Search ............. 359/199.2, 359/199.3, 199.4, 200.6, 200.7, 200.8, 204.1, 359/221.2, 298
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 6,768,562 B1* | 7/2004 | Takada et al. | 358/296 |
| 7,283,291 B2* | 10/2007 | Maram et al. | 359/298 |
| 7,605,965 B2* | 10/2009 | Tani et al. | 359/224.1 |
| 7,697,181 B2* | 4/2010 | Mizoguchi | 359/199.3 |
| 7,742,016 B2* | 6/2010 | Hagood et al. | 345/55 |
| 7,804,636 B2* | 9/2010 | Cummings et al. | 359/290 |
| 2005/0057793 A1* | 3/2005 | Starkweather et al. | 359/298 |
| 2005/0243446 A1* | 11/2005 | Wood | 359/846 |
| 2007/0285638 A1* | 12/2007 | Ravensbergen et al. | 355/53 |

FOREIGN PATENT DOCUMENTS

| | | |
|---|---|---|
| JP | 06-283404 | 10/1994 |
| JP | 11-003849 | 1/1999 |
| JP | 2001-249649 | 9/2001 |
| JP | 2005-091539 | 4/2005 |
| WO | WO 98/33096 A1 | 7/1998 |
| WO | WO 98/38597 A2 | 9/1998 |

OTHER PUBLICATIONS

Japanese Office Action for Japanese Patent Application No. 2008-321885, mailed on Jul. 19, 2011.

* cited by examiner

*Primary Examiner* — Frank Font
(74) *Attorney, Agent, or Firm* — Pillsbury Winthrop Shaw Pittman LLP

(57) ABSTRACT

A method of controlling an element of an array of individually controllable elements. The method includes varying a frequency of a driving voltage with which the element is driven.

29 Claims, 12 Drawing Sheets

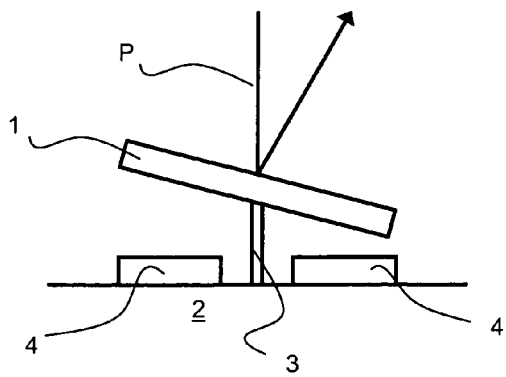
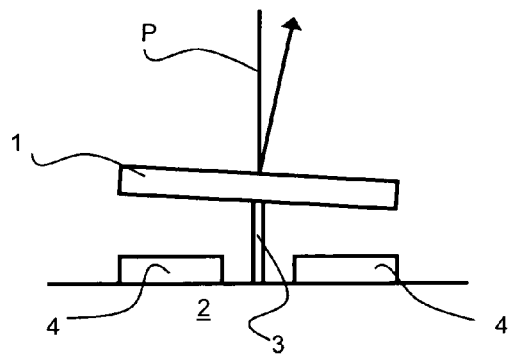
FIG. 5a  FIG. 5b
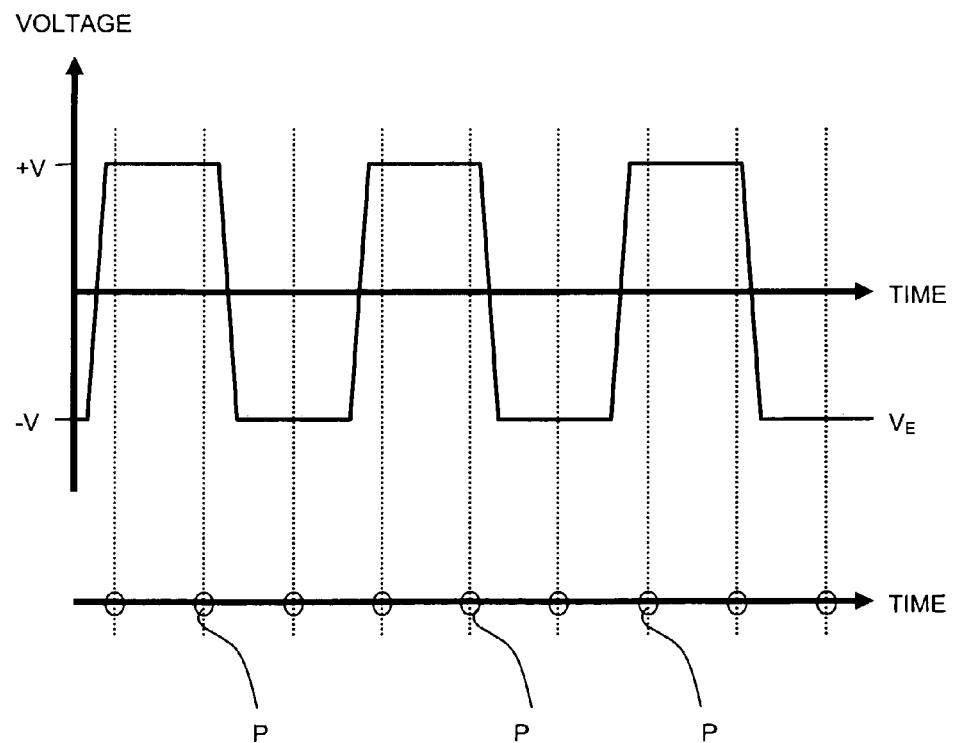
FIG. 6

ARRAY ELEMENT DEVICE CONTROL METHOD AND APPARATUS

CROSS-REFERENCE TO RELATED APPLICATIONS

This application claims the benefit of priority from U.S. provisional patent application Ser. No. 61/008,293, filed Dec. 20, 2007, the entire content of which is incorporated herein by reference.

FIELD

The present invention relates to a device control method and apparatus. The device may be part of a lithographic apparatus.

BACKGROUND

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, a patterning device, which may be referred to as a mask or a reticle, may be used to generate a circuit pattern corresponding to an individual layer of a flat panel display (or other device). This pattern may be transferred on (part of) the substrate (e.g. a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a mask, the patterning device may comprise a patterning array that comprises an array of individually controllable elements. A possible advantage of such a system compared to a mask-based system is that the pattern can be changed more quickly and for less cost. A patterning device may also be used in or as part of an illumination system of a lithographic apparatus, for example for defining an intensity distribution of a radiation beam in a pupil plane of the illumination system.

A patterning device which comprises an array of individually controllable elements is usually driven, or in other words controlled by a driving voltage. For example, if the array of individually controllably elements comprises mirrors, the degree of tilt of each of the mirrors of the array can be controlled by appropriate control of the driving voltage for that mirror. For instance, in order to tilt a mirror of the array by a certain angle, a specific voltage can be applied between the mirror and an electrode adjacent to the mirror. The applied voltage may be a non-varying DC voltage. However, it has been found that the use of a DC driving voltage may cause surface charges to become trapped and build up in the areas in and around the electrode and possibly the mirror itself. This build up of charge has an effect on the tilt of the mirror which induced by the driving voltage. For example, the build up of charge can cause the degree of tilt of the mirror to drift, even though the driving voltage itself does not change.

In order to solve the problems associated with the use of a DC driving voltage, alternating, or in other words AC, driving voltages have been employed. For example, a square wave AC driving voltage may be used, the voltage varying from a first positive voltage to a second negative voltage. By changing the polarity of the voltage used to drive the mirror, charges do not become trapped and do not build up. Therefore, the problems associated with DC driving voltages are overcome. Furthermore, since electrostatic forces are proportional to the square of the applied voltage, the change in the polarity of the AC driving voltage does not affect the force experienced by the mirror, and therefore the degree of tilt of the mirror.

Although the use of an AC driving voltage overcomes at least some of the problems associated with the use of a DC driving voltage, the use of an AC driving voltage still has disadvantages associated with it. For instance, in some arrangements where the array of individually controllable elements is used to form a pattern in the cross-section of the radiation beam, the radiation beam is formed from a plurality (e.g. thousands or millions) of radiation beam pulses. It is possible that a radiation beam pulse may be incident upon an element of the array of individually controllable elements at a time when the driving voltage changes polarity. When the driving voltage changes polarity, there may be a short period of time when the tilt of the mirror changes. A change in the tilt of the mirror will have a consequential effect on the direction of reflection of radiation beam pulse incident upon and then reflected from the mirror. If, as is usually the case, the radiation beam pulse should be directed to a high degree of accuracy, unexpected changes in the tilt of the mirror should be avoided.

In another example, it has been found that elements of the array of individually controllable elements are excited by the radiation beam pulse (i.e. from photon impulse or energy). Frequency mixing between the AC driving voltage and the radiation beam pulse frequency can result in mixed frequency terms due to a non-linear relationship between the position or orientation of the elements and the voltage that is being used to drive them. The mixed frequency terms may excite the (mechanical) eigenmodes of the elements of the array of individually controllable elements.

In yet another example, electronics used to provide or control the AC driving voltage usually have a fixed operating voltage range. In the case of a DC driving voltage, the full operating voltage range may be used to drive the elements of the array of individually controllable elements. However, when an AC driving voltage is used, the maximum swing (i.e. from maximum positive to maximum negative voltage) is equal to the maximum operating voltage range. However, the absolute applied modulation voltage is only half of that of the maximum voltage range. This means that, using the same electronics as the DC driving voltage, the force generated (and therefore the consequential tilt or movement of elements of the array) is only a quarter of that achievable using a DC driving voltage. This is because the absolute maximum driving voltage for an AC driving signal will be half of that of a DC driving signal, and the force generated is proportional to the square of the driving voltage.

SUMMARY

According to an aspect of the invention, there is provided a method of controlling an element of an array of individually controllable elements. The method includes varying a frequency of a driving voltage with which the element is driven.

According to an aspect of the invention, there is provided a control configuration arranged to control an element of an array of individually controllable elements. The control configuration is arranged to vary a frequency of a driving voltage with which the element is driven.

According to an aspect of the invention, there is provided method of controlling an element of an array of individually controllable elements. The element includes a first part and a second part arranged to interact electrostatically with one another. The method includes driving the first part of the element with a first driving voltage, and driving the second part of the element with a second driving voltage.

According to an aspect of the invention, there is provided a control configuration arranged to control a device. The device includes a first part and a second part arranged to interact electrostatically with one another. The control configuration is arranged to drive the first part with a first driving voltage, and drive the second part with a second driving voltage.

According to an aspect of the present invention, there is provided a control method in which a frequency of a driving voltage used to drive an element of an array of individually controllable elements, or a frequency with which radiation beam pulses are incident upon the element, are controlled to be synchronized with each other, such that the radiation beam pulses are not incident upon the element when the driving voltage is at a transitional voltage between a first voltage and a second voltage.

According to an aspect of the invention, there is provided a control configuration arranged to control a frequency of a driving voltage used to drive an element of an array of individually controllable elements, or a frequency with which radiation beam pulses are incident upon the element, such that the frequencies are synchronized with one another, such that the radiation beam pulses are not incident upon the element when the driving voltage is at a transitional voltage between a first voltage and a second voltage.

BRIEF DESCRIPTION OF THE DRAWINGS

FIGS. 5a and 5b schematically depict changes in the position of the element shown in FIGS. 2a and 2b;

FIG. 6 schematically depicts a radiation beam pulse and driving voltage frequency regime in accordance with an embodiment of the present invention;

DETAILED DESCRIPTION

Figure 1:
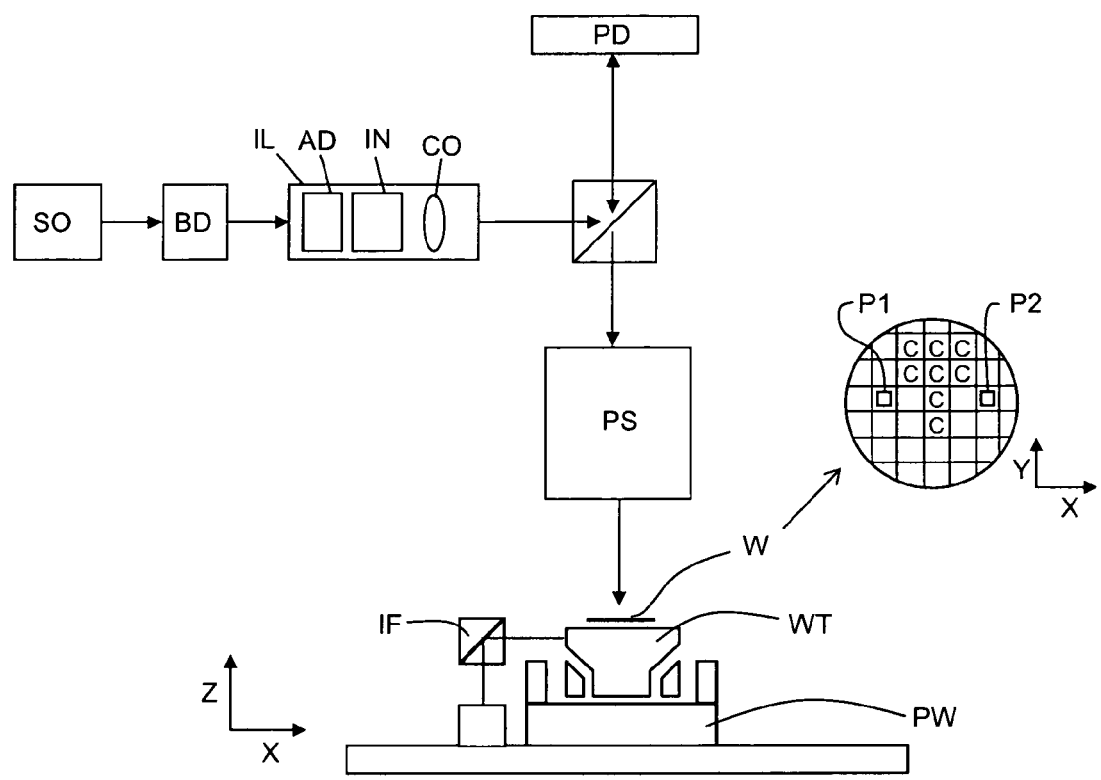
FIG. 1 schematically depicts a lithographic apparatus according to an embodiment of the invention.

FIG. 1 schematically depicts a lithographic apparatus according to an embodiment of the invention. The apparatus comprises an illumination system (illuminator) IL configured to condition a radiation beam (e.g. UV radiation), and a patterning device PD (e.g. an array of individually controllable elements) that modulates the projection beam; in general the position of the array of individually controllable elements will be fixed relative to item PS, however it may instead be connected to a positioner configured to accurately position the array of individually controllable elements in accordance with certain parameters. The apparatus also includes a substrate table WT constructed to support a substrate (e.g. a resist-coated substrate) W and connected to a positioner PW configured to accurately position the substrate in accordance with certain parameters, and a projection system (e.g. a refractive projection lens system) PS configured to project the beam of radiation modulated by the array of individually controllable elements onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronics (e.g., a computer), such as patterning devices comprising a plurality of programmable elements, that can each modulate the intensity of a portion of the radiation beam (e.g., all the devices mentioned in the previous sentence except for the reticle), are collectively referred to herein as "contrast devices". It should be appreciated that an electronically programmable patterning device having a plurality of programmable elements that impart a pattern to the radiation beam by modulating the phase of a portion of the radiation beam relative to adjacent portions of the radiation beam may also be used. In an embodiment, the patterning device comprises at least 10 programmable elements, e.g. at least 100, at least 1,000, at least 10,000, at least 100,000, at least 1,000,000, or at least 10,000,000 programmable elements. Embodiment of several of these devices are discussed in some more detail below:

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical micro-electromechanical (MEMS) devices may also be used in a corresponding manner. A diffractive optical MEMS device is comprised of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuators. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The matrix addressing may be performed using suitable electronics. More information on mirror arrays as here referred to can be gleaned, for example, from U.S. Pat. Nos. 5,296,891 and 5,523,193, and PCT Patent Application Publication Nos. WO 98/38597 and WO 98/33096.

A programmable LCD array. An example of such a construction is given in U.S. Pat. No. 5,229,872.

The lithographic apparatus may comprise one or more patterning devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm. The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In an embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist), a metrology tool and/or an inspection tool.

In an embodiment, a resist layer is provided on the substrate. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In one embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the array of individually controllable elements such that the pattern is coherently formed on the substrate.

As here depicted, the apparatus is of a reflective type (e.g. employing a reflective array of individually controllable elements). Alternatively, the apparatus may be of a transmissive type (e.g. employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, and/or 126 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if used, may be referred to as a radiation system. If the patterning device is a light source itself, e.g. a laser diode array or a light emitting diode array, the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam is incident on the patterning device PD (e.g., an array of individually controllable elements) and is modulated by the patterning device. Having been reflected by the patterning device PD, the radiation beam passes through the projection system PS, which focuses the beam onto a target portion C of the substrate W. With the aid of the positioner PW and position sensor IF2 (e.g. an interferometric device, linear encoder or capacitive sensor), the substrate table WT can be moved accurately, e.g. so as to position different target portions C in the path of the radiation beam B. Where used, the positioner for the array of individually controllable elements can be used to correct accurately the position of the patterning device PD with respect to the path of the beam B, e.g. during a scan. In an embodiment, movement of the substrate table WT is realized with the aid of a long-stroke module (course positioning) and a short-stroke module (fine positioning), which are not explicitly depicted in FIG. 1. In an embodiment, the apparatus is absent at least a short stroke module for moving substrate table WT. A similar system may also be used to position the array of individually controllable elements. It will be appreciated that the projection beam may alternatively/additionally be moveable while the object table and/or the array of individually controllable elements may have a fixed position to provide the relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, a beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0 and 90°, e.g. between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be needed if a transmissive patterning device is used.

The depicted apparatus can be used in four modes:

1. In step mode, the array of individually controllable elements and the substrate are kept essentially stationary, while an entire pattern imparted to the radiation beam is projected onto a target portion C at one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam is caused to scan a line across the substrate W. The pattern on the array of individually controllable elements is updated as desired between pulses of the radiation system and the pulses are timed such that successive target portions C are exposed at the desired locations on the substrate W. Consequently, the projection beam can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation at a substantially constant speed and the pattern on the array of individually controllable elements is updated as the projection beam scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern may be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling".

Grayscaling may provide greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, eg. at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of said point. As a further example, each point on the substrate may potentially receive radiation in a plurality of successive exposures. The radiation dose received by each point may, therefore, be alternatively or additionally controlled by exposing said point using a selected subset of said plurality of successive exposures.

In order to form the desired pattern on the substrate, each of the individually controllable elements in the patterning device should be set to the desired state at each stage during the exposure process. Therefore control signals, representing the desired states, should be transmitted to each of the individually controllable elements. Preferably, the lithographic apparatus may include a controller configured to generate the control signals. The pattern to be formed on the substrate may be provided to the lithographic apparatus in a vector-defined format such as GDSII. In order to convert the design information into the control signals for each individually controllable element, the controller may include one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a desired radiation dose map (namely a desired radiation dose profile across the substrate); converting a desired radiation dose map into desired radiation intensity values for each individually controllable element; and converting the desired radiation intensity values for each individually controllable element into corresponding control signals.

Figure 2A:
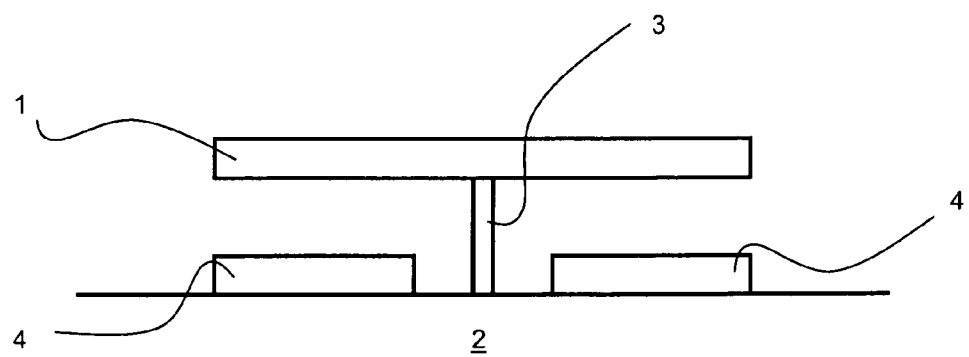
FIGS. 2a and 2b schematically depict an element of an array of individually controllable elements.

FIG. 2a schematically depicts one element of an array of individually controlled elements which may form the patterning device of a lithographic apparatus. In an embodiment, the elements may be one of a number of elements which form, for example, part of an illumination system of a lithographic apparatus, the element or elements being used to control properties of the radiation beam (for example, the angular intensity distribution of the radiation beam). As illustrated in FIG. 2a, the element comprises a mirror 1. The mirror 1 is attached to a supporting structure 2 via a fulcrum 3. The mirror may be tilted, pivoted, etc., about the fulcrum 3 by driving one or more electrodes 4 with appropriate driving voltages. The fulcrum 3 may also be described as a pivot or hinge or the like, and may be functionally defined as a structure about which the mirror 1 moves.

In FIG. 2a, only two electrodes 4 are shown. This means that the tilt of the mirror 1 can be controlled by appropriate selection of the driving voltages applied to the electrodes 4. In practice, only a single electrode may be used, or, on the contrary, more than two electrodes may be used in order to tilt the mirror 1 about more than one axis. In the following description, the driving voltage of a single electrode 4 will be discussed, although it will be appreciated that the driving voltages that are described are equally applicable to one or more of the electrodes 4 used to control the position, tilt, movement, etc., of the mirror 1.

Figure 2B:
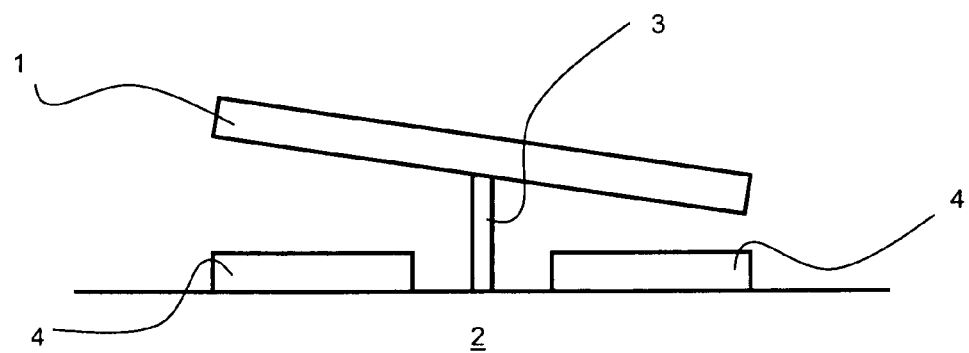

FIG. 2b schematically shows how the mirror 1 has been tilted by appropriate control of the driving voltage applied to the electrodes 4. Control or movement of the position of the mirror 1 may be achieved using electrostatic forces generated between the mirror 1 and the electrodes 4 as is known in the art. Controlling the position or movement of the mirror 1 allows the direction of a radiation beam or radiation beam pulse which reflects off the mirror 1 to be controlled.

Figure 3:
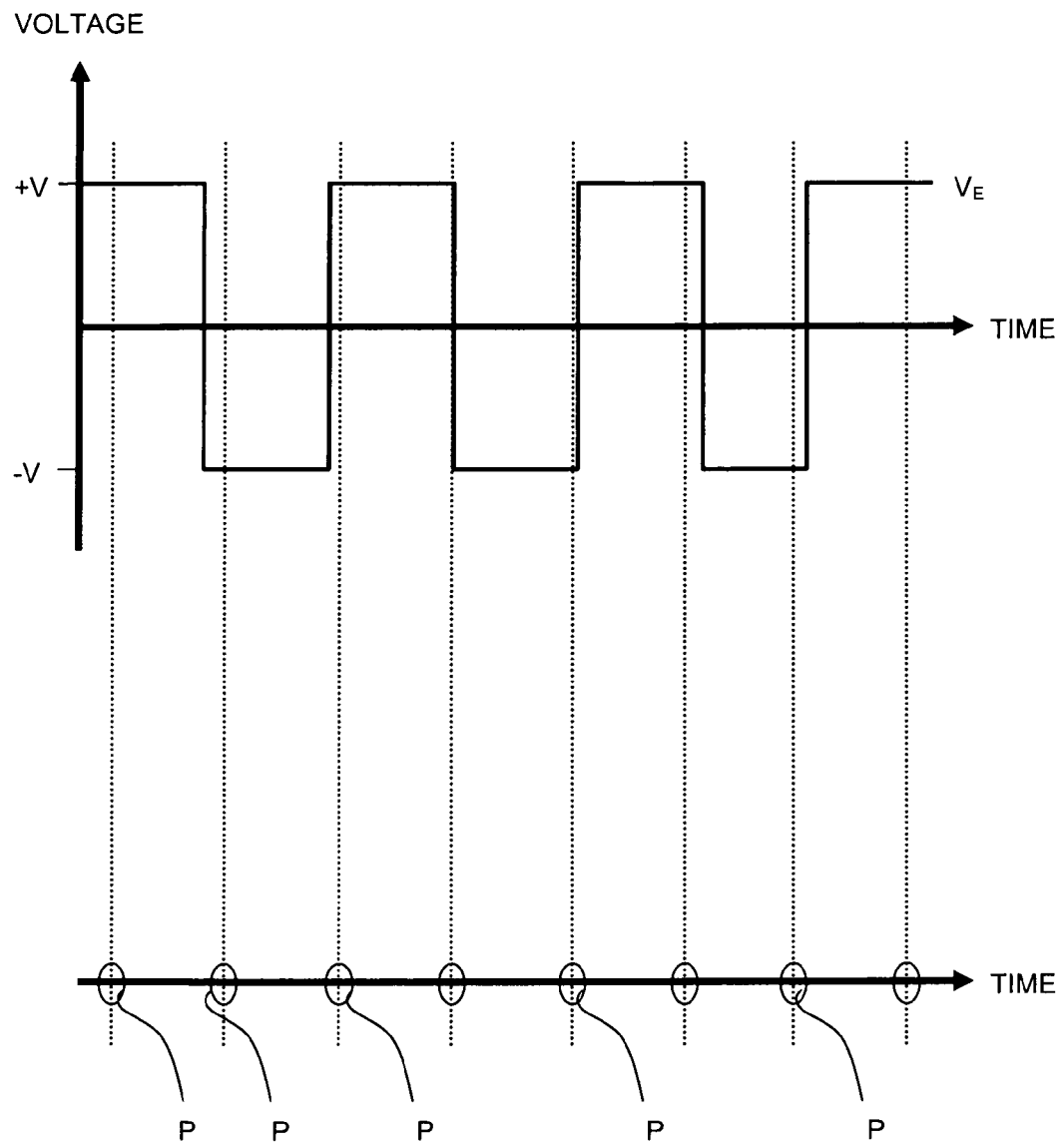
FIG. 3 schematically depicts an AC driving voltage to be applied to the element shown in FIGS. 2a and 2b, together with the timing of radiation beam pulses directed at the element.

FIG. 3 schematically shows an AC driving voltage $V_E$ applied to the electrode shown in FIGS. 2a and 2b. It can be seen that the driving voltage $V_E$ is a square wave varying from a maximum of +V volts to a minimum of −V volts. Although the polarity of the driving voltage $V_E$ changes, this does not affect the electrostatic force experienced by the mirror, since the electrostatic force is proportional to the square of the driving voltage (e.g. in other words, the sign or polarity of the driving voltage has no affect on the force experienced by the mirror). FIG. 3 also shows a plurality of radiation beam pulses P and how the timing or frequency at which these radiation beam pulses P are incident upon the mirror coincide with the driving voltage V and, in particular, the changes in polarity of the driving voltage $V_E$.

Figure 4A:
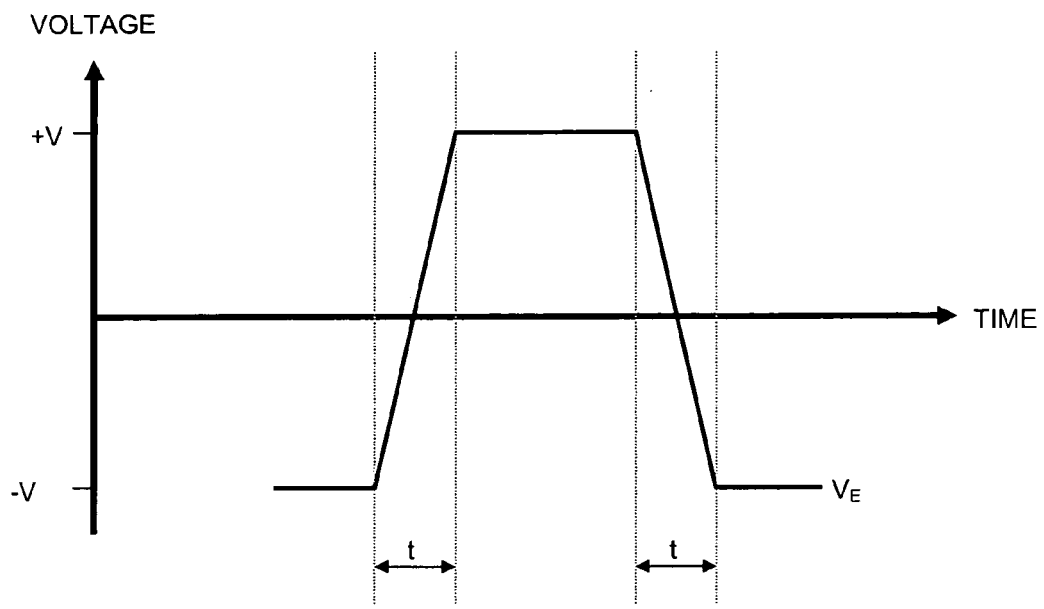
FIGS. 4a and 4b schematically depict a more detailed view of FIG. 3.

It can be seen from FIG. 3 that each time a radiation beam pulse P is incident upon the mirror, the electrode is being driven with a voltage having a magnitude of either +V volts or −V volts. As mentioned above, this means that the electrostatic force experienced by the mirror is constant, meaning that in turn, the degree of tilt of the mirror is also constant. In summary, this means that whenever a radiation beam pulse P is incident upon the mirror, the mirror is tilted to the same extent. However, FIG. 3 schematically depicts a theoretical and ideal driving voltage $V_E$. In practice, it may be difficult to provide a perfectly square wave driving voltage. FIG. 4a illustrates why this is the case.

Figure 4B:
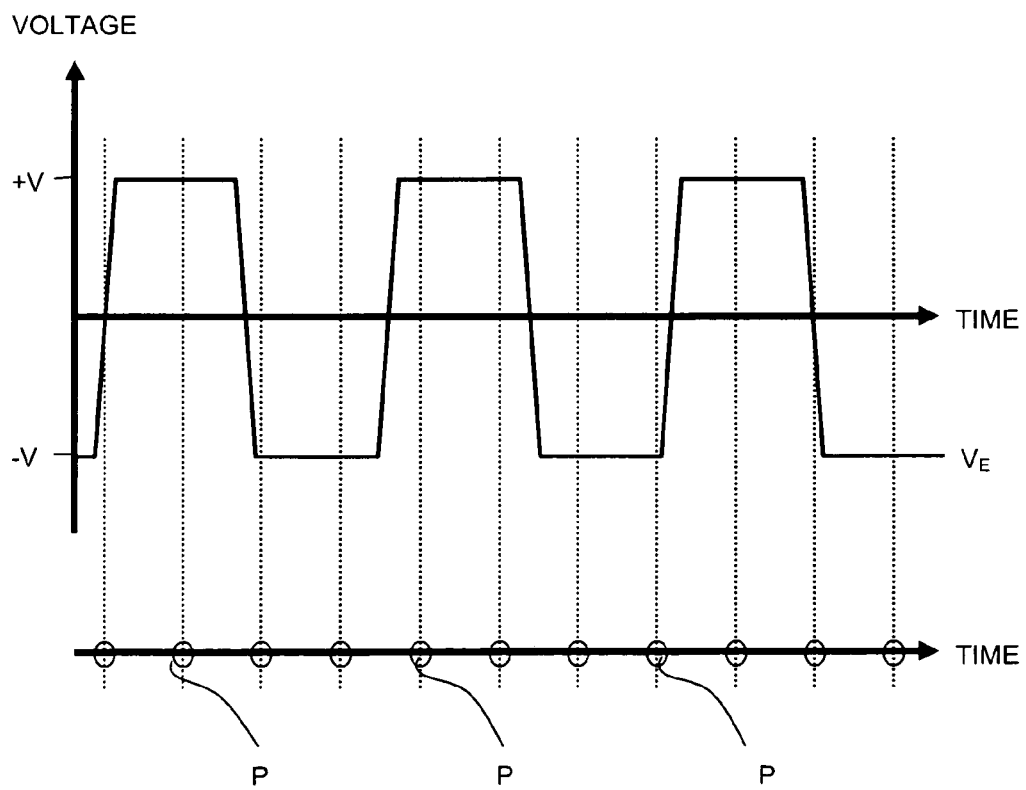

FIG. 4a shows a part of square wave driving voltage $V_E$ in practice. It can be seen that it may take a time t for the electronics providing or controlling the driving voltage to change the polarity from +V volts to −V volts. This time t may be milliseconds, microseconds, nanoseconds, etc., but nevertheless the transition between +V volts and −V volts is not typically instantaneous. FIG. 4b shows an AC square wave driving voltage $V_E$ in practice. FIG. 4b also shows a plurality of radiation beam pulses P and how the timing or frequency with which they are incident upon the mirror coincides with the AC square wave driving voltage $V_E$ in practice. It can be seen that, in practice, the timing or frequency of the incidence of the radiation beam pulses P does not always coincide with a maximum or minimum (i.e. +V volts or −V volts) driving voltage. Instead, it can be seen that some of the radiation beam pulses P will be incident upon the mirror when the AC driving voltage $V_E$ is not at a maximum or minimum, but somewhere in between the maximum and the minimum.

In theory, if the driving voltage did instantaneously change polarity from +V volts to −V volts, the tilt of the mirror induced by the driving voltage would remain constant, since the polarity of the driving voltage does not generally affect the force applied to the mirror. However, because the change in polarity (or in other words, the transition) is not instantaneous, there will be a period of time when the driving voltage applied to the mirror is neither +V volts or −V volts, but is somewhere in between. Therefore, for the time taken for the transition to occur from +V volts to −V volts, the driving voltage applied to the mirror will change, causing the tilt of the mirror to change accordingly.

FIGS. 5a and 5b schematically depict tilt of the mirror 1 as a consequence of the transitions in the driving voltage from +V volts to −V volts. FIG. 5a shows a radiation beam pulse P incident upon the mirror 1 when the electrode 4 is driven with +V or −V volts. FIG. 5b shows a radiation beam pulse P incident upon the mirror 1 when the driving voltage is in transition between +V and −V volts. It can be seen that if a radiation beam pulse P is incident upon the mirror 1 at the same time as the tilt of the mirror changes (i.e. when the driving voltage is in transition between +V and −V volts), the direction at which the radiation beam pulse P is reflected will change. Such a change in direction of the reflected radiation beam pulse P may mean, for example, that the pattern created by an array of such mirrors 1 may be distorted, which may result in a defective layer of a device created by the lithographic apparatus.

FIG. 6 schematically depicts a solution to the problems explained in relation to FIGS. 4a to 5b. FIG. 6 again shows the same driving voltage $V_E$ as is shown in and described with reference to FIG. 4b. However, the timing, or in other words frequency, of the radiation beam pulses P has now been synchronized with the driving voltage $V_E$ such that each radiation beam pulse P coincides only with a maximum of +V volts, or a minimum of −V volts. In other words, the timing or frequency of the radiation beam pulses P are chosen such that the radiation beam pulse is not coincident in time with a transitional point in the driving voltage, where the driving voltages changes from a maximum of +V volts to a minimum of −V volts. This means that even if the mirror does change position during a change in polarity of the driving voltage, the direction with which radiation beam pulses are reflected should not be affected. This is because the radiation beam pulses are not incident upon the mirror when the polarity of the driving voltage is in transition.

The synchronization can be achieved in any one of a number of ways. For example, the radiation beam pulses P can be generated and directed at the mirror a specific time after the driving voltage has switched from a maximum to a minimum, such that the transitional period is avoided. Alternatively, the frequency of the AC driving voltage $V_E$ can be altered to achieve the same effect, specifically so that the radiation beam pulses only coincide with a maximum or minimum of the square wave driving voltage, and not a transition in the polarity of the driving voltage.

Figure 7:
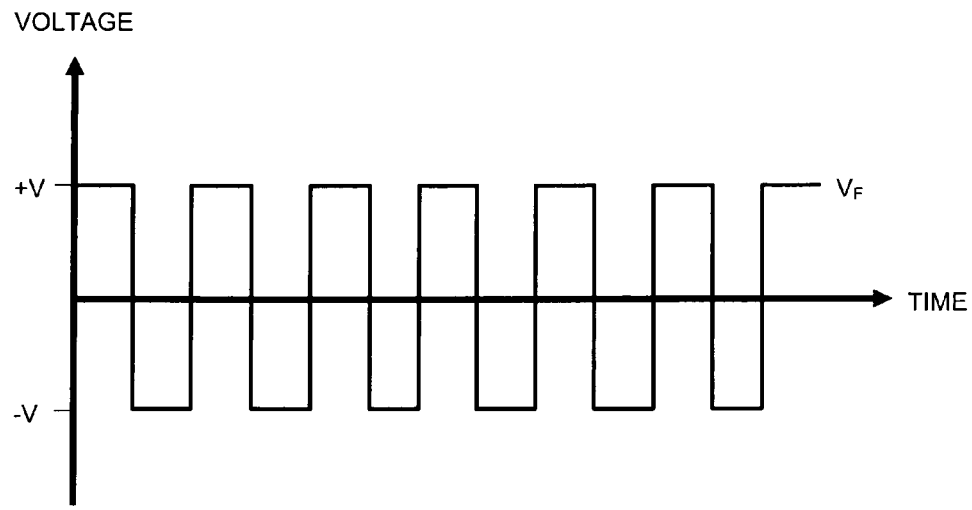
FIG. 7 schematically depicts a typical AC driving voltage used to drive the element shown in FIGS. 2a and 2b.

FIG. 7 schematically depicts a driving voltage which may be applied to the electrode of the element shown in and described with reference to FIGS. 2a and 2b. It can be seen that the driving voltage $V_F$ is a square wave AC driving voltage having a constant frequency. It has been found that when such an AC driving voltage $V_F$ is used, the relationship between the tilt of the mirror and the magnitude of the driving voltage is non-linear. It has also been found that the mirrors are excited (e.g. moved) by radiation beam pulses which are incident upon the mirror (due to photon impulse and energy). Due to the non-linearity, frequency mixing occurs between the frequency of the AC driving voltage $V_F$ and the frequency (or in other words timing) of the radiation beam pulses. Frequency mixing results in many mixed frequency terms which can excite the (mechanical) eigenmodes of the mirror or mirrors. Such excitation may result in undesirable resonance (e.g. a tilt resonance) or bending of the mirror.

One potential solution to this problem is to use a driving voltage $V_F$ which has a constant period and constant rise and fall times (e.g. high to low voltage, etc.) which together result in a constant frequency that is high enough to not excite (mechanical) eigenmodes of the mirror. Although in some cases this solution may work, it may not always work. This is for the reasons given above, namely because the relationship between the mirror tilt and the magnitude of the driving voltage $V_F$ is non linear, and because the frequency mixing between the frequency of the AC driving voltage $V_F$ and the timing or frequency of the radiation beam pulses may still result in the excitation of the (mechanical) eigenmodes of the mirror.

Figure 8:
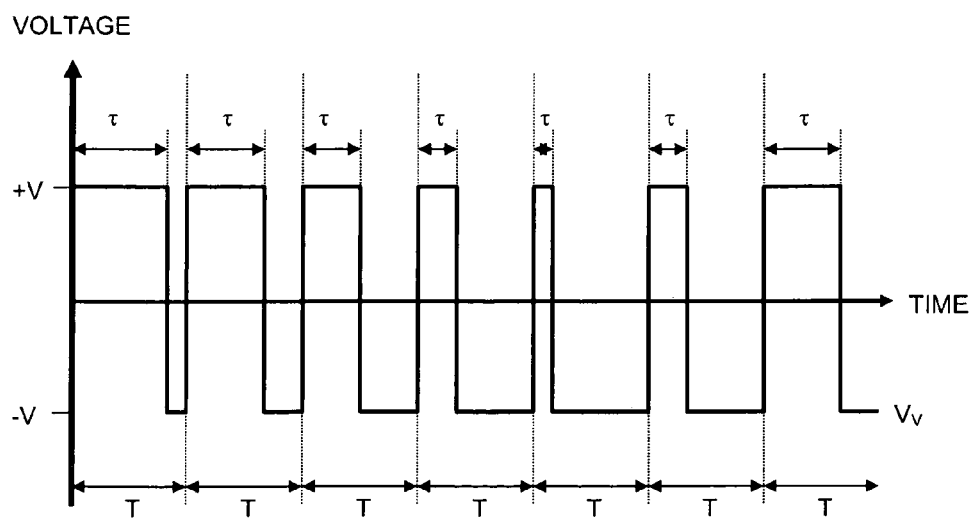
FIG. 8 schematically depicts a driving voltage regime for driving the element shown in FIGS. 2a and 2b, in accordance with an embodiment of the present invention.

FIG. 8 illustrates a square wave AC driving voltage having a variable frequency $V_V$ which may be used to overcome the problems discussed above. It can be seen from FIG. 8 that the frequency of the AC driving voltage $V_V$ varies over time. It can also be seen that the magnitude of the driving voltage $V_V$ remains constant. This is in contrast to the prior art, where an AC driving voltage with a constant frequency is used.

The effect of varying the frequency of the driving voltage $V_V$ is that the excitation of (mechanical) eigenmodes of the mirror may be reduced or eliminated. This is because any excitation energy is spread out over the frequency spectrum used for the variable frequency AC driving voltage $V_V$. As already mentioned, it can be difficult to avoid the excitation of the (mechanical) eigenmodes using only a single high frequency to the aforementioned non-linear relationships involved. By using a plurality of frequencies (in other words, a spread spectrum approach) the chances of encountering and exciting an eigenmode is reduced, and even if an eigenmode is excited, it is excited with less energy than in the prior art, due to the use of more than one frequency.

FIG. 8 shows one example of how the frequency of the transitions between +V volts and −V volts in the driving voltage $V_V$ may be varied. It can be seen that a time period T is maintained for all cycles in the change in polarity (or in other words for each 'wavelength'). The variable that is controlled is the amount of time τ in the period T for which the driving voltage $V_V$ is high (as shown in the Figure) or low. For example, the time for which the driving voltage $V_V$ is positive or negative may be controlled. In other words, the duty cycle (which is equal to τ/T) is varied. It can be seen in the Figure that the time τ for which the driving voltage $V_V$ is high is gradually decreased (or conversely, the time for which the driving voltage $V_V$ is low is gradually increased) up to a point. Then, the time τ for which the driving voltage $V_V$ is high is gradually increased (or conversely, the time for which the driving voltage $V_V$ is low is gradually decreased) up to a point. This variation continues, ensuring that the frequency with which the polarity of the driving voltage $V_V$ changes continuously varies. The variation in the frequency of the driving voltage $V_V$ has no effect on the force applied to the mirror, since, as mentioned above, the force is proportional to the square of the applied voltage such that the polarity, or changes in the polarity of the driving voltage have no effect.

The frequency of the AC driving voltage $V_V$ may be varied in any appropriate manner. For example, the variation can be random. In other words, the transition between +V volts and −V volts can occur randomly. In another example, the frequency may vary continuously, first increasing to a point and then decreasing to a point, and so on. The frequency may vary from a first value to a second value and then back down to the first value, and so on in a cyclical manner. The frequency may be varied in anyway between an upper and lower limit, for example, the frequency limits of apparatus used to control the frequency. The frequency can be varied in any appropriate manner, for example by varying the time for which the voltage is high or low (e.g. zero or non-zero), by varying the time for which the voltage is positive or negative, by varying the time for which the voltage is zero or non-zero. Alternatively or additionally, the frequency can be varied by varying the period of cycles in the change in polarity, or in other words the 'wavelength', or the time take for the voltage to be high and then low, before becoming high again.

When varying the frequency, it may be advantageous to avoid the use of certain frequencies, or ranges of frequencies. For example, it may be advantageous to avoid frequencies which are known to cause resonance of the mirror. It may be desirable, therefore, to avoid the use of a driving voltage having a frequency which is the same as or is in the vicinity of the frequency with which radiation beam pulses are incident upon the mirror.

Figure 9:
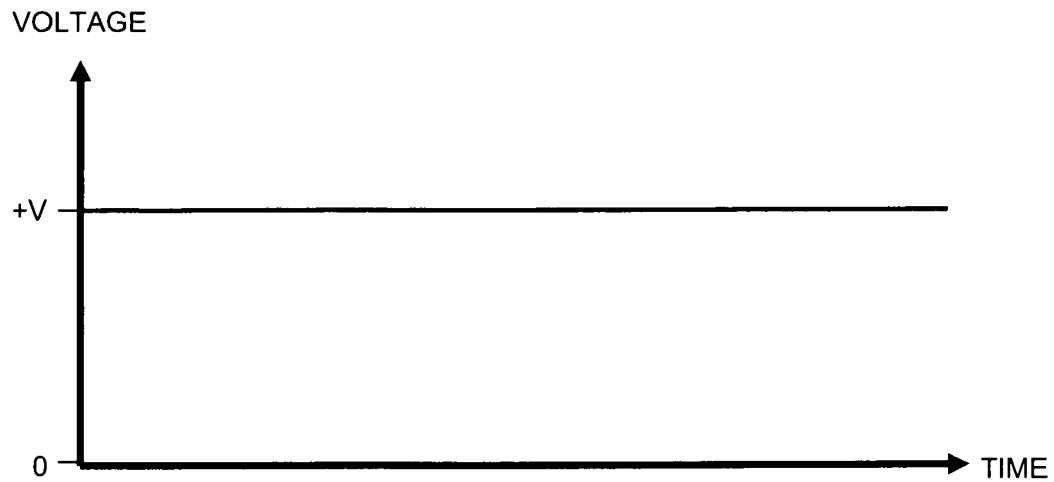
FIG. 9 schematically depicts a DC driving voltage used to drive the element of FIGS. 2a and 2b.

FIG. 9 schematically illustrates a DC driving voltage which may be applied to a mirror in order to control the degree of tilt of the mirror. As described above, the use of a DC driving voltage may have some disadvantages, such as the build up of charge and the resultant drift in the degree of tilt of the mirror. The use of an AC driving voltage is therefore often preferred.

Figure 10:
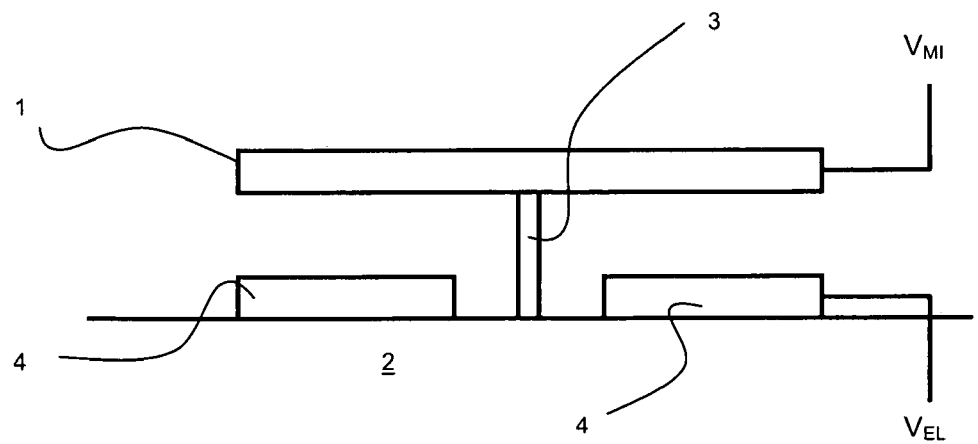
FIG. 10 schematically depicts an element of an array of individually controllable elements, together with schematic depictions of electrical connections to parts of the element.

FIG. 10 schematically shows how the degree of tilt of the mirror 1 may be controlled using an AC driving voltage. It can be seen that the electrode 4 is provided with a driving voltage of $V_{EL}$. The mirror 1 is also provided with a driving voltage $V_{MI}$. Although the Figure shows the mirror driving voltage $V_{MI}$ being provided to the mirror 1 directly, it could instead be provided to the mirror 1 via the fulcrum 3 or via any other suitable arrangement. As described above, reference is only made to one electrode, although the driving voltages and electrical connections described herein are equally applicably to more than one electrode when more than one electrode is used.

Figure 11A:
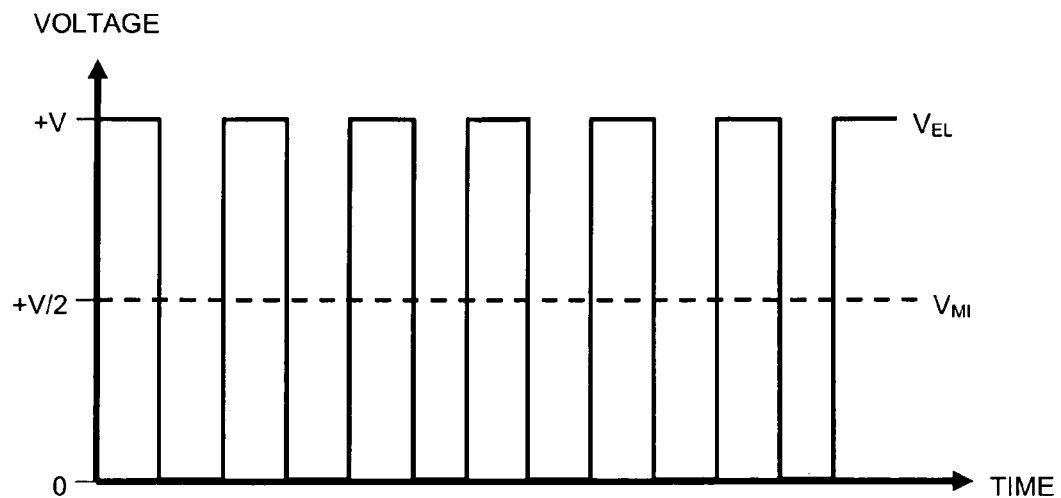
FIG. 11a schematically depicts driving voltages applied to the parts of the element shown in FIG. 10.

FIG. 11a shows the driving voltages applied to the mirror $V_{MI}$ and the electrode $V_{EL}$. In this particular example, the maximum voltage range of electronics (not shown) used to provide or control the driving voltage is "V". It can be seen that the electrode driving voltage $V_{EL}$ is a square wave varying from 0 to +V volts. It can also be seen that the mirror driving voltage $V_{MI}$ is +V/2 volts.

Figure 11B:
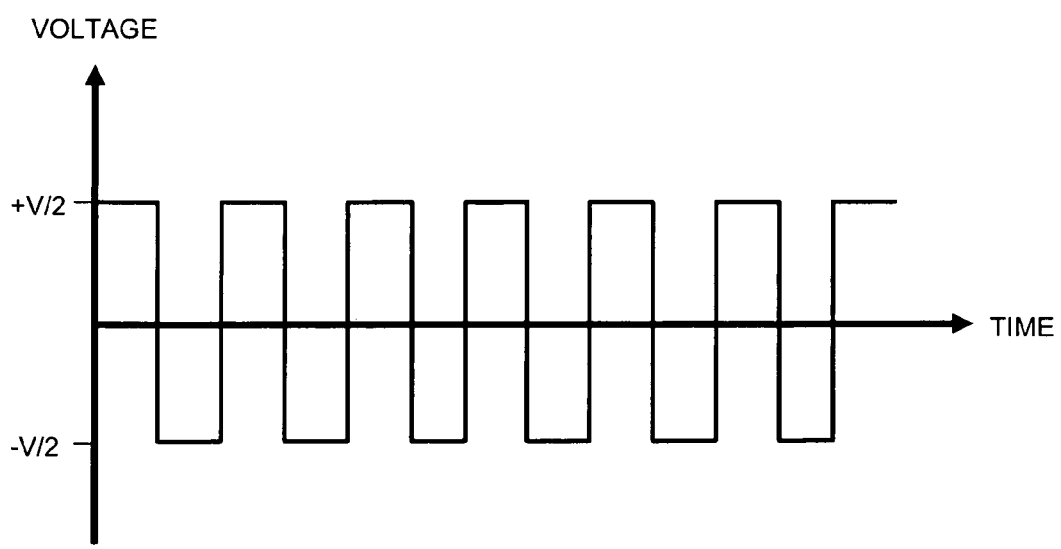
FIG. 11b schematically depicts the cumulative driving voltage experienced by a part of the element shown in FIG. 10.

FIG. 11b shows the difference between the mirror driving voltage $V_{MI}$ and the electrode driving voltage $V_{EL}$. It can be seen that the voltage difference is a square wave varying from +V/2 volts to −V/2 volts, therefore achieving a desired change in polarity of the overall driving voltage. The frequency of the voltage difference is equal to the frequency of the varying driving voltage of the electrode $V_{EL}$, since the driving voltage of the mirror $V_{MI}$ is constant.

Figure 12:
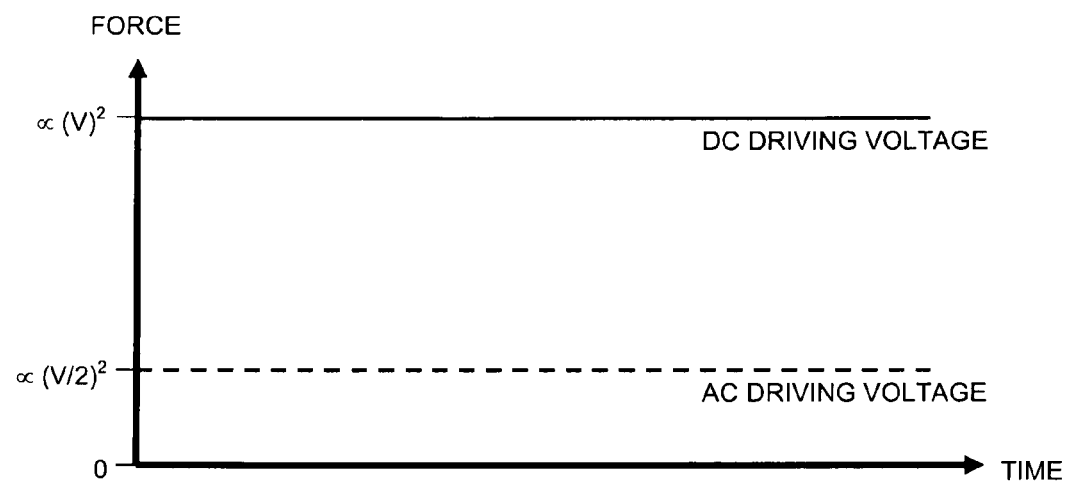
FIG. 12 schematically depicts the force experienced by a part of the elements shown in FIG. 10 using a DC driving voltage and then an AC driving voltage.

The force acting on the mirror, and therefore the degree of tilt that is possible, is proportional to the square of the voltage difference between the mirror and the electrode. The force generated by the driving voltages shown in FIGS. 11a and 11b results in a force which is proportional to $(V/2)^2$. This is shown in FIG. 12. In contrast, it can be seen that the force generated using a DC driving voltage (as illustrated in FIG. 9) is proportional to $V^2$. This means that, using the same electronics with the same operating voltage ranges, the maximum force available using a DC driving voltage regime is four times larger than the force available using an AC driving voltage regime. In other words, in order to match the forces available using a DC driving voltage, the voltage used in the AC driving voltage would need to be twice as large. In order to achieve a larger operating voltage for use in AC driving voltage regimes, larger electrodes and/or electronic components may be used. Space is at a premium in an array of individually controllable elements, for example so that the density of elements can be maximized in order to increase the resolution of a pattern formed by the array in a radiation beam. Therefore, increasing the size of elements or the space between the elements is undesirable.

Figure 13A:
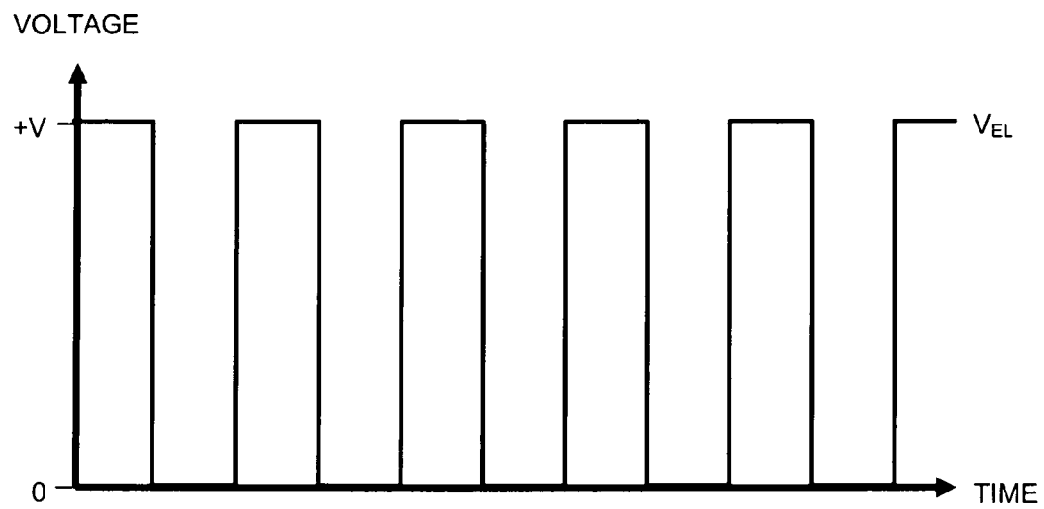
FIGS. 13a to 13d schematically depict an AC driving voltage regime in accordance with an embodiment of the present invention.

FIGS. 13a-13d schematically show a driving voltage regime according to an embodiment of the present invention. FIG. 13a schematically shows the AC driving voltage applied to the electrode $V_{EL}$. It can be seen that the driving voltage applied to the electrode $V_{EL}$ is the same as that shown in and described with reference to the regime shown in FIG. 11a. That is, the driving voltage $V_{EL}$ is a square wave having a constant frequency and varying in magnitude from 0 to +V volts.

Figure 13B:
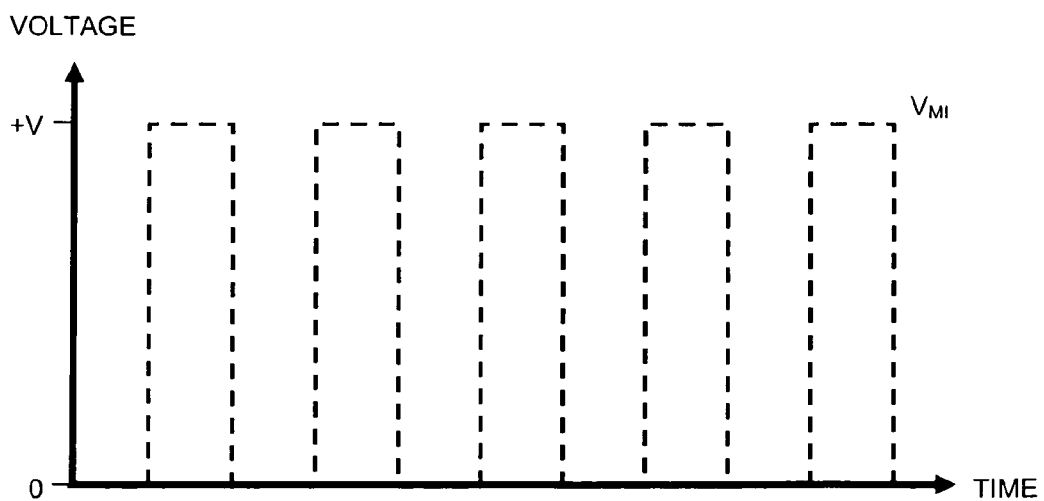
Figure 13C:
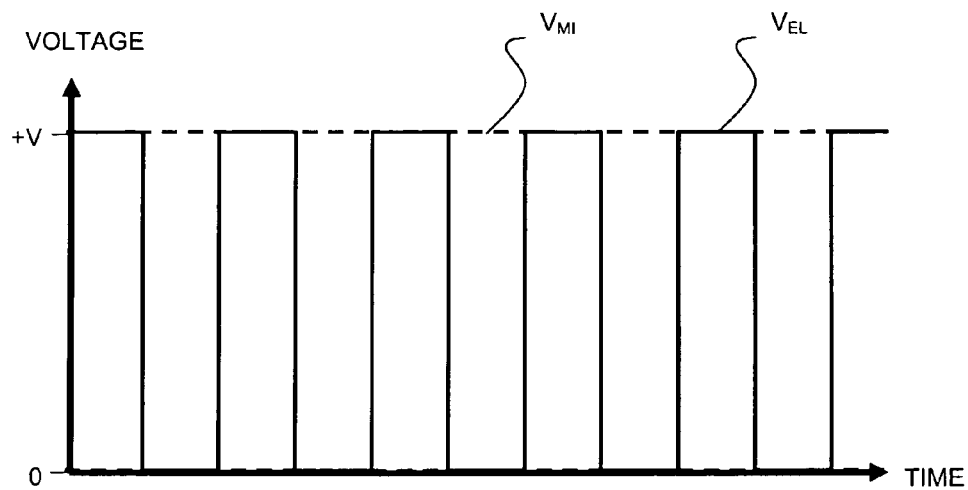

FIG. 13b shows the driving voltage applied to the mirror $V_{MI}$. It can be seen that the driving voltage applied to the mirror $V_{MI}$ is also a square wave with the same constant frequency of the electrode driving voltage $V_{EL}$, and which varies in magnitude from 0 to +V volts. This is in contrast to the regime shown in FIG. 11, where the driving voltage applied to the mirror is constant. FIG. 13c shows the driving voltage applied to the electrode $V_{EL}$ and the driving voltage applied to the mirror $V_{MI}$ in combination. It can be seen that the voltage applied to the mirror $V_{MI}$ is 180° out of phase with the voltage applied to the electrode $V_{EL}$. In other words, when the voltage applied to the electrode $V_{EL}$ is +V volts, the voltage applied to the mirror $V_{MI}$ is 0 volts, and when the voltage applied to the electrode $V_{EL}$ is zero volts, a voltage applied to the electrode mirror $V_{MI}$ is +V volts. In even more general terms, when the voltage applied to the electrode $V_{EL}$ is moving from low to high (e.g. zero to non-zero volts), the voltage applied to the mirror $V_{MI}$ is moving from high to low (e.g. non-zero to zero volts), and when the voltage applied to the electrode $V_{EL}$ is moving from high to low (e.g. non-zero to zero volts), the voltage applied to the electrode mirror $V_{MI}$ is moving from low to high (e.g. zero to non-zero volts). The voltage may not be changed from zero to a non-zero voltage, but could be changed from a positive to a negative voltage.

Figure 13D:
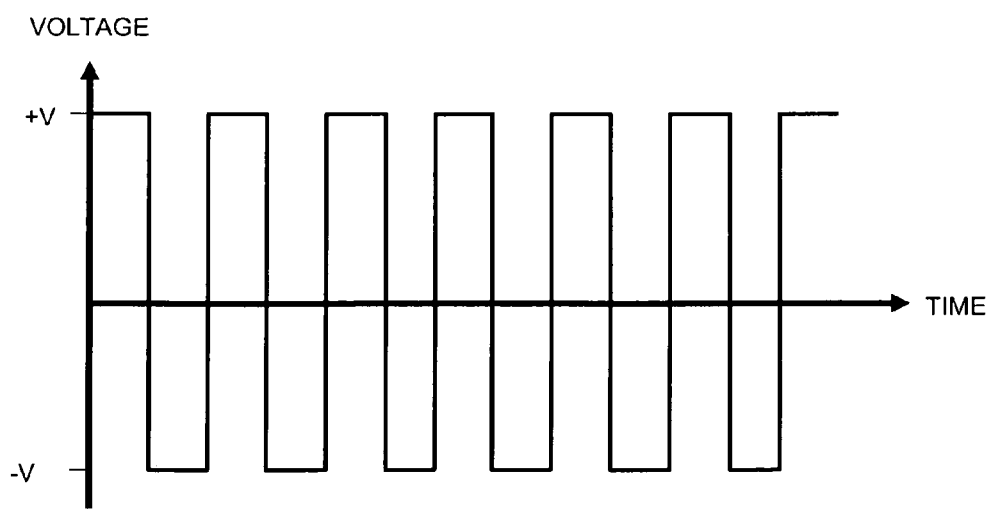

FIG. 13d illustrates the voltage difference between the two driving voltages $V_{MI}$, $V_{EL}$. It can be seen that the voltage difference is a square wave, varying in magnitude from +V volts to -V volts, and having a frequency equal to the frequency of the mirror driving voltage $V_{MI}$ and the electrode driving voltage $V_{EL}$ (which are equal). It can be seen from a comparison of FIGS. 11b and 13d that there is a significant difference between the voltage differences which the Figures illustrate. In FIG. 11b, when the voltage applied to the mirror was constant, the voltage difference between the mirror and the electrode varied only from +V/2 volts to -V/2 volts. In contrast, in FIG. 13d, where the driving voltage applied to the mirror was varied from 0 to +V volts, the difference in voltage is twice as large, specifically from +V volts to -V volts. Because the difference in voltage is larger, the force that can be generated is also larger.

Figure 14A:
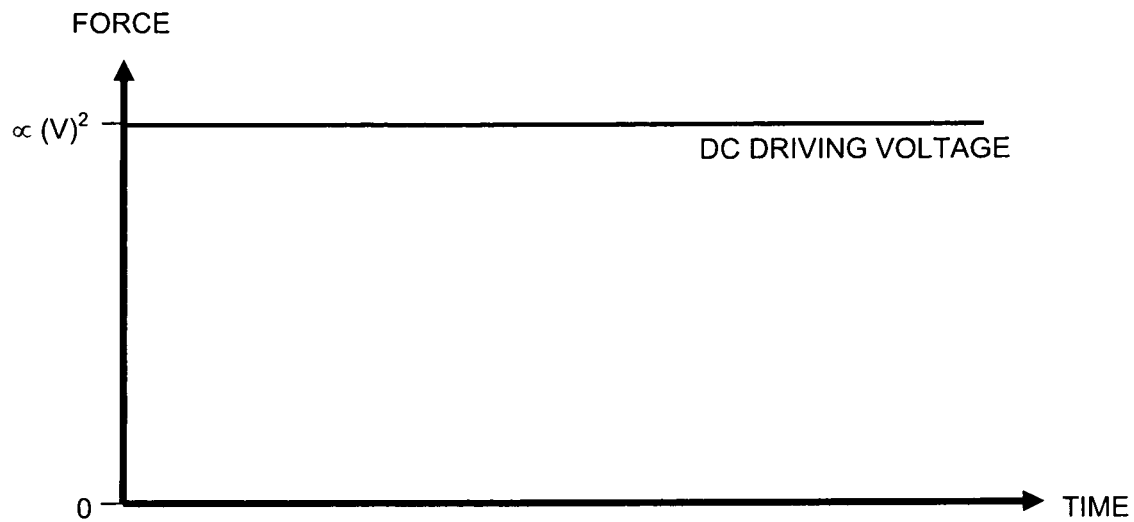
FIGS. 14a and 14b schematically depict the force experienced by a part of the element shown in FIG. 10 using a prior art DC driving voltage, and then an AC driving voltage regime in accordance with an embodiment of the present invention.
Figure 14B:
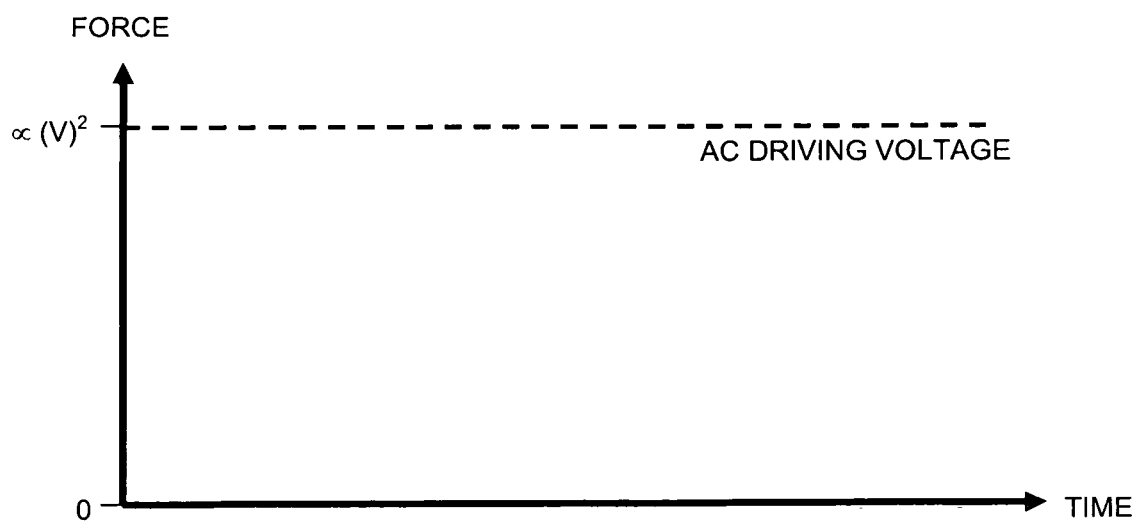

FIGS. 14a and 14b show the proportional forces that may be generated using a DC driving voltage regime and the AC driving voltage regime of FIG. 13, respectively. The electronic arrangements used to control and generated the DC or AC driving voltages have a maximum operating voltage range of V volts. The forces in either the AC or DC regime are proportional to the square of the maximum voltage difference between the mirror and electrode driving voltages. Since the maximum voltage difference is V volts in the DC regime, and V volts in the AC regime of FIG. 13, the maximum forces are equal, and are proportional to $V^2$.

It will be appreciated that in FIGS. 13a to 13d, the voltage applied to the mirror has been shown as varying from 0 to +V volts (i.e. using the maximum operating voltage range, as described above). By ensuring that the driving voltage applied to the mirror $V_{MI}$ various to this extent, the maximum possible difference between the electrode driving voltage $V_{EL}$ and the mirror driving voltage $V_{MI}$ is achievable. This means that the maximum possible force is also achievable. However, in comparison with the regime shown in and described with reference to FIG. 11 (where the mirror is driven with a constant voltage), any modulation of the driving voltage applied to the mirror may result in an increase in the difference between the electrode and mirror driving voltages $V_{EL}$, $V_{MI}$, and therefore a corresponding increase in the maximum possible generated force for a given electrode driving voltage.

It the forgoing description, the embodiments have been described independently. However, it will be appreciated that one or more of the embodiments may be combined. For instance, the embodiment relating to the correlation of the radiation beam pulse frequency and the driving voltage frequency can be combined with the embodiment relating to the variation of the frequency of the driving voltage. The embodiment relating to the correlation of the radiation beam pulse frequency and the driving voltage frequency can be combined with the embodiment relating to the modulation of the mirror driving voltage. The embodiment relating to the correlation of the radiation beam pulse frequency and the driving voltage frequency can be combined with the embodiment relating to the variation of the frequency of the driving voltage, and also the embodiment relating to the modulation of the mirror driving voltage. The embodiment relating to the variation of the frequency of the driving voltage can be combined with the embodiment relating to the modulation of the mirror driving voltage. Any two of the three embodiments can be combined. Any one embodiment improves upon known AC driving voltages applied to elements of an array of individually controllable elements. By combining embodiments, further improvements may be achievable.

All of the embodiments described above may be implemented using a suitable control configuration. For example, the control configuration could be an electronic circuit, oscilloscope, computer, signal generator, or other control device for varying the frequency of the driving voltages, and/or the modulation of the mirror driving voltage, etc. The control configuration could be an independent apparatus, or part of another piece of apparatus. The control configuration could be part of, or independent of but in communication with, a lithographic apparatus and/or a radiation source (if applicable).

In the forgoing description, tiltable mirrors have been described as the elements which form the array of individual controllable elements. This is not essential. For instance, the elements could be moveable or controllable reflective or transmissive elements etc (such as gratings, mirrors, etc.). The device may comprise a first part (e.g. a mirror) and a second part (e.g. an electrode) arranged to interact with each other using electrostatic forces (i.e. they are arranged to interact electrostatically). The driving methods and regimes mentioned above can be applied to any device which uses or is driven by an AC driving voltage, and especially those where trapped charge is a problem, or where radiation beam pulses are used. That is, the device does not need to be an array of individually controllable elements used in a lithographic apparatus. For instances, the device could be one or more elements of an array of individually controllable elements used in a projection system.

In the embodiments described above, square wave driving voltages have been discussed. The use of square wave driving voltages is not essential. Other alternating driving voltage waveforms may be used, for example sinusoidal or triangular waveforms.

In the embodiments described above, two electrodes have been shown. This means that the tilt of the mirror can be controlled by appropriate selection of the driving voltages applied to the electrodes. In practice, only a single electrode may be used, or, on the contrary, more than two electrodes may be used in order to tilt the mirror about more than one axis (e.g. two or three axes). In the forgoing description, the driving voltage of a single electrode has been discussed, although it will be appreciated that the driving voltages that are described are equally applicable to one or more electrodes used to control the position, tilt, movement etc. of the mirror or other element.

Although specific reference may be made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. A method of controlling an element of an array of individually controllable elements, the method comprising:
   varying a frequency of a driving voltage with which the element is driven,
   wherein the frequency of the driving voltage or a frequency with which radiation beam pulses are incident upon the element are controlled to be synchronized with each other, such that the radiation beam pulses are not incident upon the element when the driving voltage is at a transitional voltage between a first voltage and a second voltage.

2. The method according to claim 1, wherein the frequency is varied continuously.

3. The method according to claim 1, wherein the frequency is varied randomly.

4. The method according to claim 1, wherein the frequency is varied in a range defined by an upper and a lower limit.

5. The method according to claim 1, wherein the frequency is varied from a first value up to a second value and then back down to the first value.

6. The method according to claim 1, wherein the frequency is varied by varying the duty cycle of the driving voltage.

7. The method according to claim 1, wherein the frequency is varied by varying the time for which the voltage is high or low.

8. The method according to claim 1, wherein the frequency is varied by varying the time for which the voltage is positive or negative.

9. The method according to claim 1, wherein the frequency is varied by varying the time for which the voltage is zero or non-zero.

10. The method according to claim 1, wherein the element comprises a reflective surface or a mirror.

11. The method according to claim 10, wherein the element further comprises an electrode.

12. The method according to claim 1, further comprising using the array of individually controllable elements to form a pattern in a radiation beam.

13. The method according to claim 1, further comprising using the array of individually controllable elements in an illumination system to control properties of a radiation beam.

14. A control configuration arranged to control an element of an array of individually controllable elements, the control configuration being arranged to vary a frequency of a driving voltage with which the element is driven, wherein the configuration is arranged to control the frequency of the driving voltage or a frequency with which radiation beam pulses are incident upon the element such that the frequencies are synchronized with one another, such that the radiation beam pulses are not incident upon the element when the driving voltage is at a transitional voltage between a first voltage and a second voltage.

15. The control configuration according to claim 14, wherein the array of individually controllable elements form part of an illumination system.

16. A method of controlling an element of an array of individually controllable elements, the element comprising a first part and a second part arranged to interact electrostatically with one another, the method comprising:
   driving the first part of the element with a first driving voltage; and
   driving the second part of the element with a second driving voltage,
   wherein the frequency of the first driving voltage and/or the second driving voltage, or a frequency with which radiation beam pulses are incident upon the element, are controlled to be synchronized with each other, such that the radiation beam pulses are not incident upon the element when the first driving voltage and/or the second driving voltage are at a transitional voltage between a first voltage and a second voltage.

17. The method according to claim 16, further comprising controlling the first driving voltage and the second driving voltage such that
   when the first driving voltage moves from a low to a high voltage, the second driving voltage moves from a high to a low voltage; and
   when the first driving voltage moves from a high to a low voltage, the second driving voltage moves from a low to a high voltage.

18. The method according to claim 16, further comprising controlling the first driving voltage and the second driving voltage such that
when the first driving voltage moves from a zero voltage to a non-zero voltage, the second driving voltage moves from a non-zero voltage to a zero voltage; and
when the first driving voltage moves from a non-zero voltage to a zero voltage, the second driving voltage moves from a zero voltage to a non-zero voltage.

19. The method according to claim 16, further comprising controlling the first driving voltage and the second driving voltage such that
when the first driving voltage moves from a negative to a positive voltage, the second driving voltage moves from a positive to a negative voltage; and
when the first driving voltage moves from a positive to a negative voltage, the second driving voltage moves from a negative to a positive voltage.

20. The method according to claim 16, wherein the first driving voltage has a frequency that is equal to a frequency of the second driving voltage.

21. The method according to claim 16, wherein the second driving voltage varies in magnitude from zero volts to a voltage equal to that of a maximum operating range of an apparatus used to provide the second driving voltage.

22. The method according to claim 16, wherein the first part of the element is an electrode.

23. The method according to claim 16, wherein the second part comprises a reflective surface or a mirror.

24. The method according to claim 16, further comprising using the array of individually controllable elements to form a pattern in a radiation beam.

25. The method according to claim 16, further comprising using the array of individually controllable elements in an illumination system to control properties of a radiation beam.

26. A control configuration arranged to control a device, the device comprising: a first part and a second part arranged to interact electrostatically with one another, the control configuration being arranged to:
drive the first part with a first driving voltage; and
drive the second part with a second driving voltage,
wherein the configuration is arranged to control the frequency of the first driving voltage and/or the second driving voltage, or a frequency with which radiation beam pulses are incident upon the element such that the frequencies are synchronized with one another, such that the radiation beam pulses are not incident upon the element when the first driving voltage and/or the second driving voltage are at a transitional voltage between a first voltage and a second voltage.

27. The control configuration according to claim 26, wherein the array of individually controllable elements form part of an illumination system.

28. A method of controlling an element of an array of individually controllable elements, the element comprising a first part and a second part arranged to interact electrostatically with one another, the method comprising:
driving the first part of the element with a first driving voltage; and
driving the second part of the element with a second driving voltage,
wherein the first driving voltage has a frequency that is equal to a frequency of the second driving voltage.

29. A method of controlling an element of an array of individually controllable elements, the element comprising a first part and a second part arranged to interact electrostatically with one another, the method comprising:
driving the first part of the element with a first driving voltage; and
driving the second part of the element with a second driving voltage,
wherein the second driving voltage varies in magnitude from zero volts to a voltage equal to that of a maximum operating range of an apparatus used to provide the second driving voltage.

* * * * *